(12) United States Patent
Interrante et al.

(10) Patent No.: US 6,809,041 B2
(45) Date of Patent: Oct. 26, 2004

(54) LOW DIELECTRIC CONSTANT FILMS DERIVED BY SOL-GEL PROCESSING OF A HYPERBRANCHED POLYCARBOSILANE

(75) Inventors: Leonard Vincent Interrante, Schenectady, NY (US); Ning Lu, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 10/339,336

(22) Filed: Jan. 10, 2003

(65) Prior Publication Data

US 2004/0000715 A1 Jan. 1, 2004

Related U.S. Application Data

(60) Provisional application No. 60/392,851, filed on Jul. 1, 2002.

(51) Int. Cl.[7] .................. H01L 21/31; H01L 21/469; H01L 23/58
(52) U.S. Cl. ............................. 438/780; 257/632
(58) Field of Search .................. 257/632, 642, 257/644, 650; 438/780–782, 778, 790

(56) References Cited

U.S. PATENT DOCUMENTS

| | | |
|---|---|---|
| 5,153,295 A | 10/1992 | Whitmarsh et al. |
| 5,602,060 A | 2/1997 | Kobayashi et al. |
| 5,789,325 A | 8/1998 | Chandra et al. |
| 6,225,238 B1 | 5/2001 | Wu |
| 6,255,238 B1 | 7/2001 | Brocheton |
| 6,362,279 B2 | 3/2002 | Lichtenhan et al. |
| 6,384,172 B1 * | 5/2002 | Dvornic et al. .......... 528/15 |
| 6,455,130 B1 | 9/2002 | Wallace et al. |
| 2002/0132496 A1 * | 9/2002 | Ball et al. .............. 438/780 |

OTHER PUBLICATIONS

Interrante et al., "Silicon–based ceramic precursors from polymer precursors" Pure and Applied Chemistry 74(11), 2002, pp. 2047–2053.*

Shu Yang et al., "Nanoporous ultralow dielectric constant organosilicates templated by tri–block co–polymers" Chemistry of Materials, 2002, 14, pp. 369–374.*

Interrante et al. "Sol–gel synthesis of a siloxypolycarbosilane gel and its pyrolytic conversion to silicon oxycarbide" Chemistry of Materials, 1998, No. 10, pp. 4047–4054.*

Interrante et al. "Sol–gel synthesis of a siloxypolycarbosilane gel and its pyrolytic conversion to silicon oxycarbide" Chemistry of Materials, 1994, 1(6), pp. 51–57.*

Low–Dielectric–Constant Materials for ULSI Interlayer–Dielectric Applications, Wei William Lee, et al, MRS Bulletin/Oct. 1997.

Pursuing the Perfect Low–k Dielectric, Laura Peters, Semiconductor International, vol. 21, No. 9, 1988, p. 1–8.

Low–k Dielectrics: Will Spin–On or CVD Prevail?, L. Peters, Semiconductor International, vol. 23, No. 6 2000, p. 1–9.

(List continued on next page.)

Primary Examiner—Erik Kielin
(74) Attorney, Agent, or Firm—Foley & Lardner LLP

(57) ABSTRACT

A hybrid organic/inorganic organosilicon networked polymer material having a compositional formula $[Si(O)CH_2]_n$ and a dielectric constant of less than 2.4 is provided. The material may be used as an interlayer dielectric film in a semiconductor device. The film is preferably fabricated by a sol-gel process using an alkoxy substituted hyperbranched polycarbosilane precursor material.

41 Claims, 6 Drawing Sheets

OTHER PUBLICATIONS

The Challenge of Low K, Issues and Considerations for Accelerated Per formance, Peter Nunan, Yield Management Solutions, Spring 2000, p. 17–22.

C.B. Case, et al, Mat. Res. Soc. Symp. Proc. 443, 177, (1997).

$SiO_2$ aerogel film as a novel intermetal dielectric, Moon–Ho Jo, et al, J. Appl. Phys. 82 (3), Aug. 1, 1997, p. 1299–1304.

R. Ramos, et al, Mat. Res. Soc. Symp. Proc. 443, 91 (1997).

Industry Divides on Low–k Dielectric Choices, May 1, 2001, L. Peters, Semiconductor International May (2001).

Structural Comparison of Hydrogen Silsesquioxane Based Porous Low–*k* Thin Films Prepared with Varying Process Conditions, Hae–Jeong Lee, et al, Chem. Mater. 2002, 14, 1845–1852.

Structural Control of Oligomeric Methyl Silsesquioxane Precursors and Their Thin–Film Properties, Long–Hua Lee, et al, Journal of Polymer Science: Part A: Polymer Chemistry, vol. 40, 1560–1571 (2002).

S. Sugahara, T., et al, Preparation and Characterization of Low–k Silca Film Incorporated with Methylene Groups, J. Eletrochem Soc. 148(6), (2001)).

A Proposed Organic–Silica Film for Inter–Metal–Dielectric Application, Satoshi Sugahara, et al, J. App. Physics, vol. 38, (1999), Part 1.

Synthesis of Polycarbosilane/Siloxane Hybrid Polymers and Their Pyrolytic Conversion to Silicon Oxycarbide Ceramics, Q. Liu, et al., Chem. Mater. 1997, 9, 2434–2441.

Role of Precursor Molecular Structure on the Microstructure and High Temperature Stability of Silicon Oxycarbide Glasses Derived from Methylene–Bridged Polycarbosilanes, Gian Domenico Soraru, Chem. Mater. 1998, 10, 4047–4054.

Synthesis and Structure of a Highly Branched Polycarbosilane Derived from (Chloromethyl) trichlorosilane, Chris K. Whitemarsh, et al, Organometallics 1991, 10, 1336–1344.

Processing and Characterizations of Silica Xerogel Films for Low–K Dielectric Applications, Anurag Jain, et al. Mat. Res. Soc. Symp. Proc., vol. 565, 1999.

Pyrolysis Chemistry of Polycarbosilane Polymer Precursors to Ceramics, Doctoral Thesis of Qi Liu, Rensselaer Polytechnic Institute, Troy, New York Jul. 1998, pp. ii–vii, 44, 72–73, 137–142.

* cited by examiner

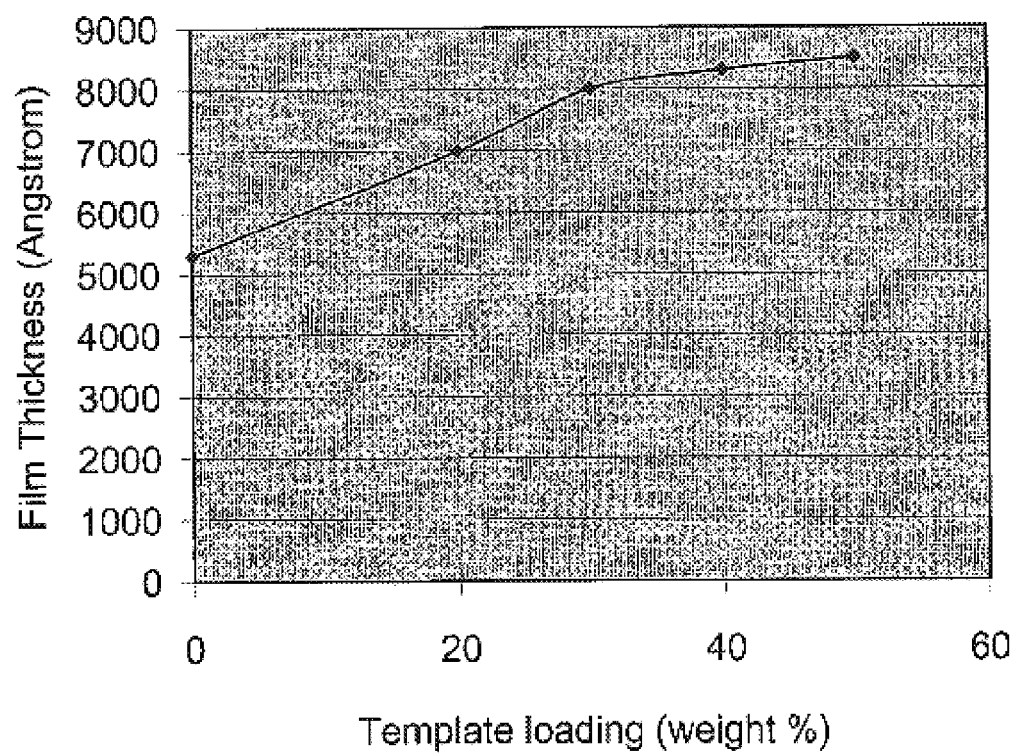
FIGURE 1A  Film Thickness vs. Template Loading

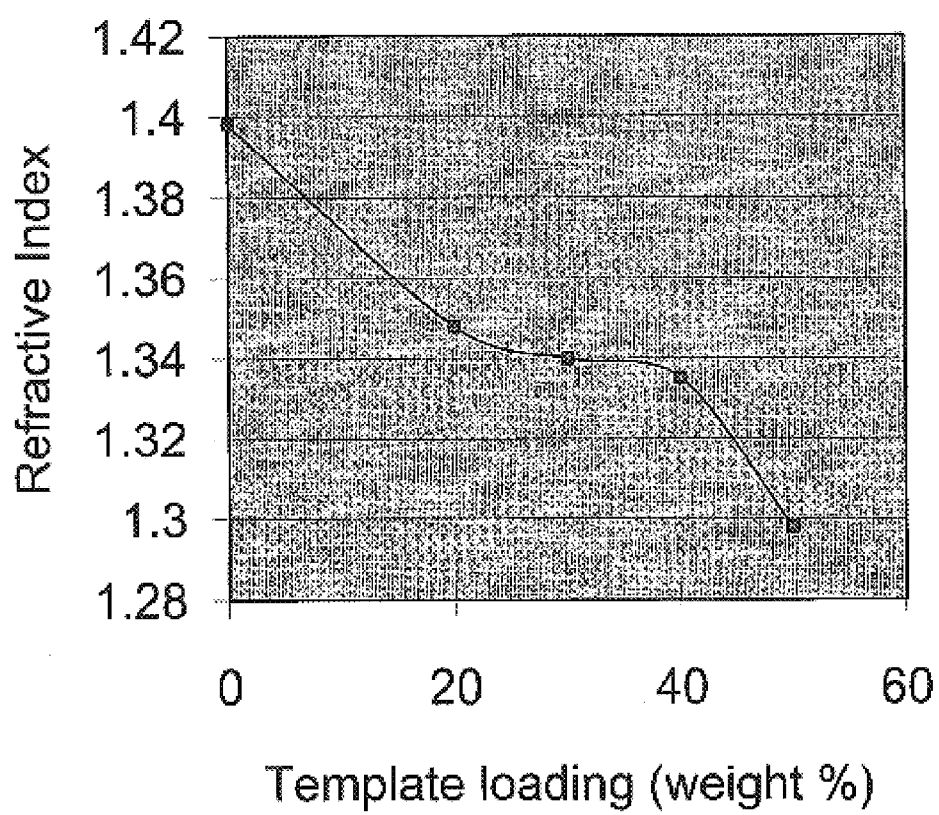
FIGURE 1B  Refractive Index vs. Template Loading

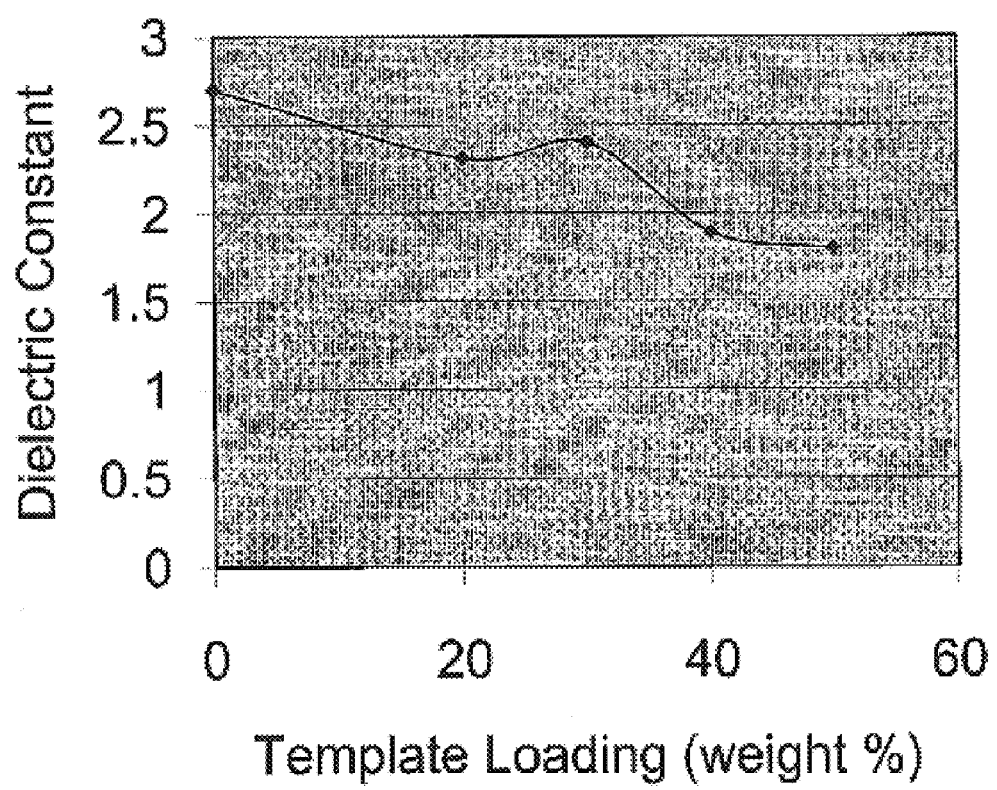
FIGURE 1C    Dielectric Constant vs Template Loading

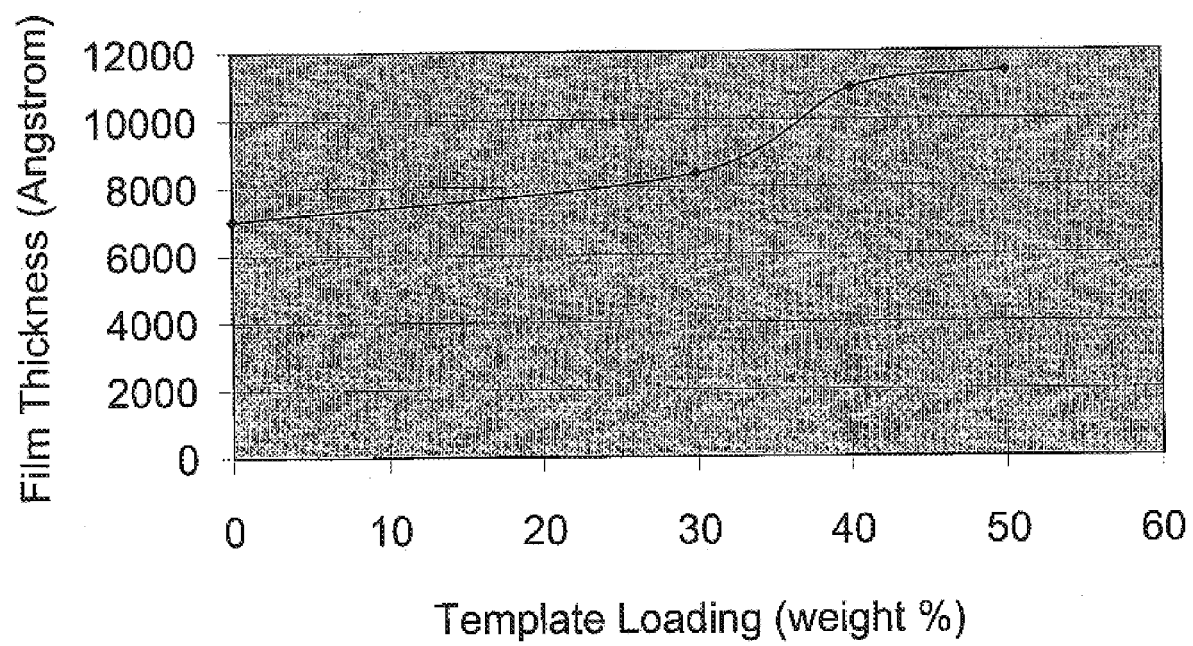

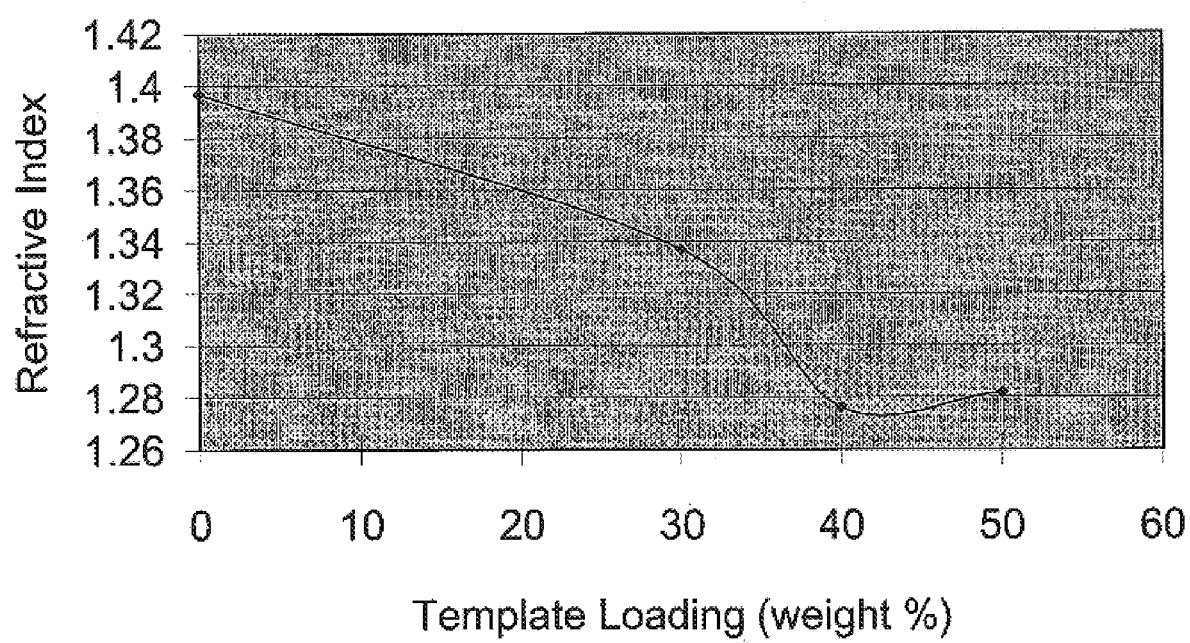

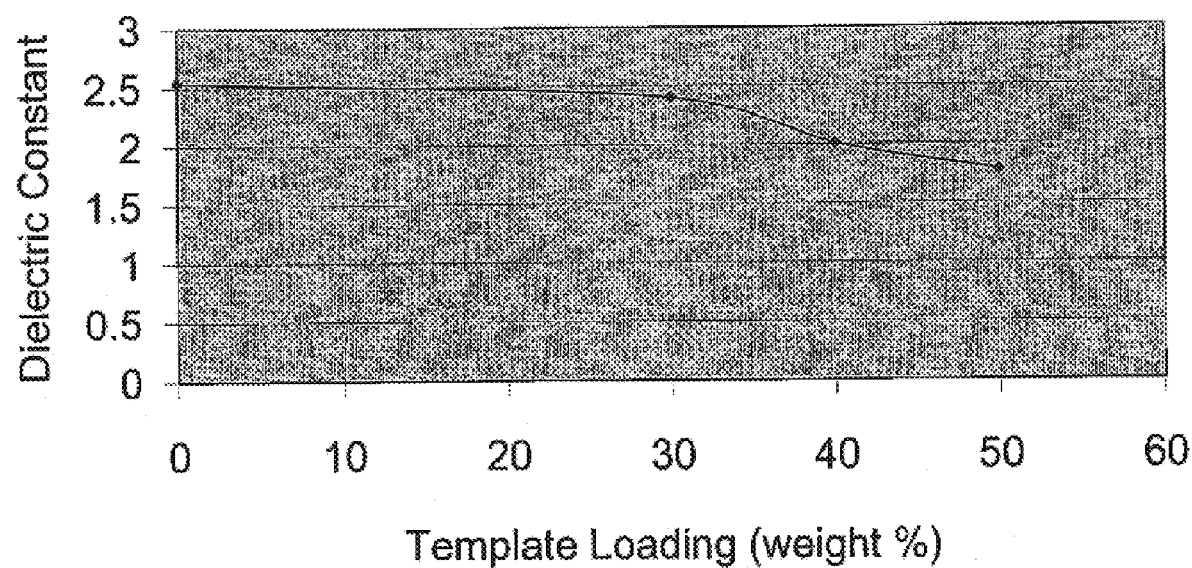
FIGURE 2C Dielectric Constant vs. Template Loading

LOW DIELECTRIC CONSTANT FILMS DERIVED BY SOL-GEL PROCESSING OF A HYPERBRANCHED POLYCARBOSILANE

STATEMENT REGARDING FEDERALLY SPONSORED RESEARCH & DEVELOPMENT

The U.S. government may have certain rights in this invention pursuant to grant number CHE-0109643 from the National Science Foundation.

FIELD OF THE INVENTION

The present invention is directed generally to low dielectric constant films and more particularly to low dielectric constant films prepared by a sol-gel method using hyperbranched polycarbosilane as a precursor.

BACKGROUND OF THE INVENTION

The growth of integrated circuit (IC) technology is primarily based on the continued scaling of devices to ever-smaller dimensions. Smaller devices provide higher packing density and higher operating speed. In the ultra-large-scale integration (ULSI) era, the millions, and soon to be billions, of transistors on a chip must be interconnected to give desired functions. As minimum device features shrink below 0.25 microns, the increase in propagation delay, cross-talk noise and power dissipation of the interconnect become limiting factors. It is, therefore, desirable to reduce the interconnect capacitance in order to maintain the trend of reduced delay time, reduced power consumption and reduced noise for future scaled devices. Capacitance is directly proportional to dielectric constant (k).

Currently the most common semiconductor dielectric is silicon dioxide, which has a dielectric constant of about 4.0. Thus there is substantial interest in materials with low dielectric constants that can replace $SiO_2$-based insulators as inter layer dielectrics (ILD), as discussed in W.W. Lee and Paul S. Ho, "Low-Dielectric-Constant Materials for ULSL Interlayer Dielectric Applications", MRS Bulletin, 19, October, (1997). However, these materials should also meet many other criteria besides low dielectric constant. Table I lists some the requirements for low k dielectrics, as discussed in Laura Peters, "Pursuing the Perfect Low-k Dielectric", Semiconductor International, Vol. 21, No. 9, (1998).

TABLE I

| | |
|---|---|
| Dielectric constant | 2.4–2.0 |
| Thermal stability | High thermal conductivity |
| | Tg >400° C., stable above 425° C. for short period |
| | Low thermal expansion coefficient |
| Electronic properties | High reliability |
| | Leakage current similar to $SiO_2$ |
| | Dissipation factor <0.01 |
| | Low charge trapping |
| Film composition | Low film stress |
| | >2 mm thick cracking threshold |

Many materials have been proposed as candidates for low-k ILDs. These materials fall into three categories: organic, inorganic, and hybrid materials (generally organosiloxanes). The two deposition techniques being most strongly investigated are chemical vapor deposition (CVD) and spin-on deposition. Spin-on deposition lends itself to a much wider class of materials and deposition conditions are much easier to establish, as discussed in L. Peters, "Low-k Dielectrics: Will Spin-On or CVD Prevail?", Semiconductor International, Vol. 23, No. 6, (2000).

Due to their hydrophobic properties and reduced polarizability, organic materials typically have a lower dielectric constant at equivalent porosities than do inorganic materials. Most spin-on organic polymers are significantly different from spin-on glass because moisture does not evolve during curing, and they have superior crack resistance, as discussed in P. Nunan, Yield Management Solutions, 17, Spring, (2000). However, with many materials in this category, thermal stability is a primary concern. In the temperature regime around 425° C., these organic polymers typically undergo severe outgassing and have already begun to decompose, as discussed in C. B. Case, A. Kornblit, M. E. Mills, D. Castillo, R. Liu, Mat. Res. Soc. Symp. Proc. 443, 177, (1997).

In contrast, inorganic materials are generally integrated more easily into existing semiconductor manufacturing processes because they retain a $SiO_2$-like matrix. Examples of inorganic materials are silica xerogels and aerogels, as described in A. Jane, S. Rogojevic, S. V. Nitta, V. Pisupatti, W. N. Gill, P. C. Wayner, J. L. Plawsky, Mat. Res. Soc. Symp. Proc., 565, 29, (1999) and in M. Jo, H. Park, D. Kim, S. Hyun, S. Choi, J. Paik, J. Appl, Phys. 82(3), 1299, (1997), respectively. In addition, these inorganic materials are very thermally stable due to the strong Si—O bonding. But strong Si—O bonding also brings high polarizability and brittleness to the materials. Nanoporous silica, a porous $SiO_2$ network structure, has been developed to lower the dielectric constant while keeping its high thermal stability, as described in L. Peters, "Industry Divides on Low-k Dielectric Choices." Semiconductor International, May (2001) and T. Ramos, K. Roderick, A. Maskara, D. M. Smith, Mat. Res. Soc. Symp. Proc. 443, 91, (1997). However, the ability to control the pore structure still needs to be improved.

Organic/inorganic hybrid materials are attractive since they may gain some advantages from both the organic and inorganic regimes. In particular, silsesquioxanes, with the empirical formula $(RSiO_{3/2})_x$, where R is hydrogen or an organic group, have attracted much attention as promising candidates for low dielectric constant materials, as described in H. Lee, E. K. Lin, H. Wang, W. Wu, W. Chen, E. S. Moyer, Chem. Mater. 14, 1845, (2002) and L. Lee, W. Chen, W. Liu, J. Poly. Sci. Part A: Polymer Chemistry, Vol. 40, 1560, (2002).

Various alkoxysilanes, including tetraethoxy silane [Si(OEt)$_4$], RSi(OR)$_3$ (R=H and alkyl or aryl), and (R'O)$_3$Si—R—Si(OR')$_3$ (R=ethylene, phenylene, and various organic linking groups), have been used as precursors in the sol gel preparation of silica and organosiloxane films. Some of these films have been found to show relatively low dielectric constants, as discussed in S. Sugahara, T, Kadoya, K. Usami, T. Hattori, M. Matsumura, J. Electrochem. Soc. 148(6), (2001) and S. Sugahara, K. Usami, M. Matsumura, J. Appl. Phys., Part 1 38(3A), 1428, (1999).

Polycarbosilanes, in which Si—C bonds form the backbone of the polymer, can be viewed as a "hybrid" between the purely organic and inorganic polymers. They can potentially combine the advantages of these two classes of polymers. The Si—C bond is essentially non-polar (the silicon atom has a slight positive charge), which lessens the opportunity for electrophilic or nucleophilic attack on the Si—C bond, as well as lowering the bond dipole contribution to the overall dielectric constant relative to the Si—O bonds in silica. This makes the Si—C bond the most chemically inert bond that a silicon atom can form.

In U.S. Pat. No. 5,602,060, incorporated by reference herein, a solution of a specified polycarbosilane is applied in a solvent onto a substrate having electrically conductive components fabricated therein. The coated layer of the polycarbosilane is then cured in an oxidizing atmosphere to convert the polycarbosilane layer to a silicon oxide layer. The resulting silicon oxide layer has a planarized surface and shows no cracking. However the dielectric constant is not low enough to meet the ILD dielectrics requirements. Moreover, the final layer obtained after the atmospheric curing is basically silica and thus has no organic character remaining.

U.S. Pat. No. 6,255,238, incorporated by reference herein in its entirety, describes how hydridopolycarbosilanes can be subjected to heating under controlled conditions to generate certain cross-linked polyorganosilicon films having low dielectric constants of between 2.4 and 3.8. The heating can be done by a thermal source, an electron-beam, UV light and any other high-energy source. The patent indicates that baking the gelled film at several different sequentially elevated temperatures in air prior to curing the gelled film in an inert ambient decreases the dielectric constant to between 2.4 and 3. However, a dielectric constant below 2.4 could not be obtained by the method disclosed in this patent.

An alkoxy-substituted, hyperbranched polycarbosilane can be synthesized by Mg-induced coupling of $Cl_3SiCH_2SiCl_3$, followed by the substitution of Cl by the methoxy or ethoxy group, as described in Q. Liu, W. Shi, F. Babonneau and L. V. Interrante, Chem. Mater., 9, 2434, (1997). This hyperbranched polymer has a complex structure with a distribution of Si environments that range from $CH_2Si(OR)_3$ to $(CH_2)_4Si$ and an average molecular weight (Mn) of ca. 600-1000 AMU. The $Si(OR)_n$ groups can be subjected to hydrolysis and condensation via the "sol-gel" process to give, after drying and complete condensation, an inorganic/organic network polymer having the compositional formula, $[Si(O)CH_2]_n$ that contains both Si—O—Si and Si—$CH_2$—Si bridging groups, and under certain circumstances at least, was found to have high internal porosities, and to resist weight loss and other chemical changes to almost 600° C., as discussed in G. D. Soraru, Q. Liu, L. V. Interrante and T. Apple, Chem. Mater., 10, 4047, (1998).

A Ph.D. thesis of Qi Liu, granted by the Chemistry Department, Rensselaer Polytechnic Institute, Troy, N.Y., July 1998 describes efforts to prepare such inorganic/organic network polymer films. Although the films were successfully obtained by Ms. Liu by using sol-gel processing these films were quite thin (1,788 Angstroms or less) and had refractive indexes ranging from 1.43 to 1.36, which is only slightly lower than those of silica films, suggesting loss of the porosity during film processing and a dielectric constant of above 2.5.

BRIEF SUMMARY OF THE INVENTION

A preferred embodiment of the present invention provides a hybrid organic/inorganic organosilicon networked polymer material having a compositional formula $[Si(O)CH_2]_n$ and a dielectric constant of less than 2.4.

Another preferred embodiment of the present invention provides a method of making a hybrid organic/inorganic film, comprising providing an alkoxy substituted hyperbranched polycarbosilane precursor material, dissolving the precursor material in a solvent to form a solution, adding a catalyst to the solution, coating the solution over a substrate to form a gelled film, and curing the gelled film to remove the solvent from the gelled film, such that the hybrid organic/inorganic film with a dielectric constant of less than 2.5 is formed.

BRIEF DESCRIPTION OF THE DRAWINGS

FIG. 1A is a graph of template loading percent (x-axis) versus film thickness (y-axis), for films made using n-butanol solvent according to examples 8 to 12 of the present invention.

FIG. 1B is a graph of template loading percent (x-axis) versus film refractive index (y-axis), for films made using n-butanol solvent according to examples 8 to 12 of the present invention.

FIG. 1C is a graph of template loading percent (x-axis) versus film dielectric constant (y-axis), for films made using n-butanol solvent according to examples 8 to 12 of the present invention.

FIG. 2A is a graph of template loading percent (x-axis) versus film thickness (y-axis), for films made using iso-butanol solvent according to examples 13 to 16 of the present invention.

FIG. 2B is a graph of template loading percent (x-axis) versus film refractive index (y-axis), for films made using iso-butanol solvent according to examples 13 to 16 of the present invention.

FIG. 2C is a graph of template loading percent (x-axis) versus film dielectric constant (y-axis), for films made using iso-butanol solvent according to examples 13 to 16 of the present invention.

DETAILED DESCRIPTION OF THE INVENTION

The present inventors have realized that a hybrid organic/inorganic organosilicon networked polymer material having a compositional formula $[Si(O)CH_2]n$ may be prepared such that its dielectric constant is less than 2.5, preferably less than 2.4, more preferably less than 2.3, most preferably less than 2.2 such as less than 2. The material preferably contains both Si—O—Si and Si—$CH_2$—Si bridging groups in its backbone. For example, the dielectric constant of the material may range from 1.78 to 2.5, preferably from 1.78 to 2.3, more preferably 1.78 to 2.0, such as 1.91 to 1.99. The material is prepared by subjecting an alkoxy substituted hyperbranched polycarbosilane precursor to a sol-gel process to generate tough, adherent, solvent-resistant, organosilicon films which have, after drying and further condensation by heating up to 500° C., dielectric constants as low as 2.0 or less.

In one preferred embodiment of the present invention, the dielectric constant of the material comprises an intrinsic dielectric constant of the material without artificially induced porosity. Preferably, the intrinsic dielectric constant of the material is less than 2.4, preferably 2.1 or less, more preferably 2 or less, such as 1.91 to 1.99.

In another preferred embodiment of the present invention, the dielectric constant of the material comprises an "extrinsic" dielectric constant because the material contains artificially introduced porosity, such as by introducing a template material into a precursor solution and then vaporizing or otherwise removing the template material during a curing step in the sol-gel process. Preferably, the "extrinsic" dielectric constant of the material is less than 2.4, preferably 2.1 or less, more preferably 2 or less, such as 1.78 to 1.99.

Preferably, the material comprises an interlayer dielectric (ILD) film located in a semiconductor or other solid state device. Preferably, the thickness of the film ranges from 200 to 1,140 nm, more preferably 600 to 1,140 nm, such as 800 to 1,000 nm. The ILD film may be used in any suitable semiconductor or solid state device, such as a microprocessor, memory (i.e., DRAM, SRAM, EEPROM), ASIC or PLA. The semiconductor device contains at least one semiconductor active device, such as a transistor in a semiconductor substrate or over an insulating substrate.

The ILD film is preferably located between and electrically isolates at least two conductive layers. Preferably, the at least two conductive layers comprise metal, silicide, titanium nitride or polysilicon interconnect metallization layers, such as Al, Cu, titanium silicide or TiN. The metallization layers are preferably located above the active devices and interconnect the active devices. The ILD may be located between different metallization levels and/or between metallization lines in the same level. The ILD film may be located in direct contact with one or more conductive layers or another dielectric film may be located between the hybrid ILD film and the conductive layer(s). For example, the hybrid ILD film may be sandwiched between one or more inorganic dielectric layers, such as silicon dioxide, silicon nitride, silicon oxynitride or aluminum oxide, wherein these inorganic dielectric layers contact the conductive layers.

However, the hybrid material use is not limited to an ILD film in a solid state device. The material may be used in any other suitable device instead. For example, the material may be used as a gas separation membrane, a microfluidic tunnel or a waveguide.

The hybrid organic/inorganic networked organosilicon polymer material having a compositional formula [Si(O)CH$_2$]$_n$ of the preferred embodiments of the present invention is preferably prepared by a sol-gel method. The sol-gel method includes providing an alkoxy substituted hyperbranched polycarbosilane precursor material and dissolving the precursor material in a solvent to form a solution. The method further includes adding a catalyst to the solution and then coating the solution over a substrate to form a coated material (i.e., a gelled film). The gelled film is then cured to remove the solvent from the gelled film, such that a hybrid organic/inorganic film with a dielectric constant of less than 2.5 is formed. The preferred precursor material is a commercially obtained methoxy substituted, hyperbranched, polycarbosilane which is dissolved in a suitable organic solvent. The preferred catalyst is diluted aqueous hydrochloric acid which is preferably added to the solution after the precursor material. The resultant mixture is preferably applied over the substrate by spin-coating. The coating is cured by heating the coating in an inert ambient, such as a nitrogen atmosphere at a suitable temperature, such as 400 to 500° C. to remove the solvent and complete the condensation of residual Si—OH groups to Si—O—Si linkages.

In general, the processing conditions are preferably chosen to simulate the processing of hybrid films with high internal porosities. The preferred materials and process parameters are described below. However, the present invention should not be considered limited by these materials and parameters, and other suitable materials and process parameters may also be used instead.

The preferred precursor material is a methoxy-substituted, hyperbranched polycarbosilane having the formula [(MeO)$_3$SiCH$_2$]$_w$[(MeO)$_2$SiCH$_2$]$_x$[MeOSiCH$_2$]$_y$[SiCH$_2$]$_z$, which will be referred to as "MeOPCS". This material may be obtained from Starfire Systems, Inc., 877 25$^{th}$ St., Watervleit, N.Y., as a viscous, yellowish liquid. Its synthesis involves Mg-induced coupling of ClCH$_2$SiCl$_3$, followed by the partial substitution of Cl by methoxy groups, as described in C. Whitmarsh and L. V. Interrante, Organometallics, 10, 1336, (1991) and in U.S. Pat. No. 5,153,295, both incorporated herein by reference in their entirety.

Another preferred precursor material is a partially butoxy-substituted hyperbranched polycarbosilane (i.e., a methoxy and butoxy substituted hyperbranched polycarbosilane). It is synthesized through an alcohol exchange reaction between MeOPCS and n-Butanol. Thus, the preferred alkoxy substituted hyperbranched polycarbosilane precursor material has a compositional formula: [(XO)$_3$SiCH$_2$]$_w$[(XO)$_2$SiCH$_2$]$_x$[XOSiCH$_2$]$_y$[SiCH$_2$]$_z$, where XO is selected from a group consisting of methoxy (MeO) and a combination of methoxy and butoxy (MeO, BuO). Other suitable alkoxy substituted hyperbranched polycarbosilanes may also be used instead.

It should be noted that the alkoxy substituted hyperbranched polycarbosilane is currently manufactured by Starfire Systems, Inc. as an intermediate in the production of "HPCS", a hyperbranched hydridopolycarbosilane, which is used as the precursor material in the method of U.S. Pat. No. 6,225,238. Without wishing to be bound to any particular theory of operation, the present inventors believe that the use of the alkoxy substituted hyperbranched polycarbosilane rather than hyperbranched hydridopolycarbosilane as the precursor material is one factor leading to the reduced dielectric constant of the hybrid material of the present invention compared to the material of U.S. Pat. No. 6,225,238.

Various organic solvents, such as 1-butyl alcohol, 2-butyl alcohol and 2-methylpropanol, can be employed in the sol-gel method. The solvent should be compatible with water and the polycarbosilane, as well as the template materials of the second preferred embodiment of the present invention. In addition, the boiling point of the solvent should be high enough to prevent fast solvent evaporation, which induces film cracking. The most preferred solvents are iso-butanol and n-butanol. However, other organic solvents, such as dibutyl ether, xylene, benzene, toluene, hexane, cyclohexane and heptane, may also be used.

The preferred catalyst for the sol-gel process is dilute (aqueous) hydrochloric acid, such as a 0.2M to 1.0 M HCl. Other suitable catalysts may be used instead. While the catalyst is preferably added to the solution after the precursor material, the catalyst may be added to the solvent prior to adding the precursor material if desired. Without wishing to be bound to any particular theory of operation, the present inventors believe that the addition of the catalyst is another factor leading to the reduced dielectric constant of the hybrid material of the present invention compared to the material of U.S. Pat. No. 6,225,238.

In a first preferred embodiment of the present invention, a template forming material for artificially generating pores in the film is not used to form the hybrid material. Thus, according to the first preferred embodiment of the present invention a dielectric constant of less than 2.5, such as less than 2.3, preferably less than 2 comprises an intrinsic dielectric constant of the film. An intrinsic dielectric constant is a dielectric constant of a material in which artificial pore generators, such as template forming materials, are not used in the manufacture of the hybrid material.

In a second preferred embodiment of the present invention, a template material is added to the solution containing the precursor material. The template material is then removed from the material coated over the substrate during the curing step such that porosity is introduced into the material. Any suitable template material which is vaporized, decomposed or otherwise removed from the hybrid material during curing to form pores in the hybrid material may be used. Preferably, the template material comprises a triblock copolymer of poly(ethylene oxide-b-polypropylene oxide-b-ethylene oxide) (PEO-b-PPO-b-PEO). This material is available under the trade name Pluronic P103® from BASF. This polymer has relative molecular mass of 4, 950 and PEO mass fraction of 30%.

The process of the preferred embodiments of the present invention may also have one or more optional steps. In other words, these steps may be omitted if desired and/or used in any suitable combination.

The first optional step is a surface modification step of the material that is spin coated over a substrate. The surface modification step preferably comprises immersing the coated material in a solution of 10 wt % trimethylchlorosilane in hexanes for 1–5 hours, such as 2–4 hours. This step is provided to cap any residual (Si)—OH groups. The surface modification step preferably occurs after the solution is spin coated onto a substrate, but before the curing step. If desired, the coated material may be washed with an appropriate fluid, such as hexane, prior to the surface modification.

The second optional step is aging. The aging step is performed by immersing the coated material in a suitable solution, such as a solution of 5 vol % of 1M NH$_4$OH in iso-butanol, for several hours (i.e., 2–4 hours) to several days (i.e., 1–4 days), such as for 2 hours to 4 days, preferably 4 to 48 hours. If desired, the coated material may be allowed to gel in air for 30 to 90 minutes prior to the aging step. The aging step preferably occurs after the solution is spin coated onto a substrate, but before the curing step.

The third optional step is baking. The baking step is performed by heating the coated (i.e., gelled) material to a temperature below 400° C. in an oxidizing ambient. For example, the coated material may be heated in an oven in air at 100 to 250° C., such as at 120° C., for 20 to 60 minutes, such as for 30 minutes. The baking step preferably occurs after the solution is spin coated onto a substrate, but before the curing step. If desired, a multi-step baking procedure described in U.S. Pat. No. 6,225,238 may also be used. In this procedure, the coated material is baked at several different, progressively increasing temperatures.

The following process parameters are preferred for the sol-gel process of the preferred embodiments of the present invention. However, other suitable parameters may be used instead if desired. The weight ratio of polycarbosilane precursor material to the solvent preferably ranges from 1/3 to 1/8, such as 1/4 to 1/5. The weight ratio of polycarbosilane to H$_2$O preferably ranges from 2/1 to 1/1. The concentration of hydrochloric acid solution preferably ranges from 0.1M to 1.5 M, such as from 0.2M to 1.0M. In the second preferred embodiment, the weight ratio of template material to the polycarbosilane precursor material preferably ranges from 1/5 to 2/3, more preferably from 1/5 to 1/2.

The time that elapses from the time the solution is prepared (i.e., after the catalyst is added) to before the spin coating step begins preferably ranges from 5 min to 30 min, preferably less than 15 minutes. This time period is referred to as "aging in air" in the specific examples below. Without wishing to be bound to any particular theory of operation, the present inventors believe that a decrease in the time period between when the completed solution is prepared and when the solution is spin coated over the substrate leads to a decrease in the dielectric constant of the hybrid material of the present invention. Thus, this time period is preferably shortened to 15 minutes or less, such as 1–15 minutes.

The spinning speed of the substrate during the spin coating step preferably ranges from 800 rpm to 2000 rpm, more preferably from 800 rpm to 1500 rpm. The spinning time preferably ranges from 25 seconds to 60 seconds. The curing temperature comprises about 400 to about 500° C. reached at a rate of about 1 to about 1.5° C./minute and holding at about 400 to about 500° C. for about 30 to about 180 minutes, such as about 60 to 120 minutes in an inert ambient. For example, the film may be heated to 400° C. at the rate of 1° C./minute in flowing nitrogen atmosphere and then held for 1–2 hours at 400° C. Alternatively, the film may be heated to 500° C. at the rate of 1.5° C./min in flowing nitrogen atmosphere and then held at this temperature for 2 hours.

SPECIFIC EXAMPLES

The following specific examples of sol-gel film production method are provided to illustrate the preferred embodiments of the present invention, and should not be considered limiting on the scope of the claims. In the examples, film thickness and refractive index were measured with a Woolam Ellipsometer. To measure the dielectric constant of the films, aluminum dots of 0.5 mm to 1.5 mm diameter were evaporated onto the film surface through a shadow mask to form a Metal-Insulator-Metal (MIM) structure. The capacitance was measured at 1 MHz and 30 mV using a HP 4192A LF impedance analyzer. The dielectric constant, k, was calculated according to the following equation: $C = k A_\epsilon_o/d$, where A is the area of the Al dot (m$^2$), C is the capacitance (Farad), d is the film thickness (m) and $\epsilon$o is the permittivity of free space (8.85×10$^{-12}$ F/m). All of the films described in the following examples were remeasured in air at ambient relative humidity after allowing them to stand in room air for at least 2 weeks and found to have the same dielectric constant, within the accuracy of the measurement (±5%).

Example 1

0.668 g of MeOPCS was dissolved in 3.34 grams of iso-butanol. Then 0.334 g of 1.0 M hydrochloric acid was added. The mixture was sonicated for 2 minutes to ensure homogeneity. It was then filtered through a 0.2 micron filter. After aging in air for 30 minutes, several drops of the solution were dropped onto a Si wafer substrate (2 cm×2 cm, stuck at the center of a piece of 2"×2" cover glass by means of double stick tape). Then the wafer was spun at 1000 rpm for 25 seconds. The film was gelled in air for about 60 minutes before aging. Aging was carried out by immersing the gelled film in a solution of 5 vol % of 1.0M NH$_4$OH in iso-butanol (pH 9.5) and allowing the film to stand at room temperature for 4 days. Then the film was heated to 400° C. at the rate of 1° C./min in a flowing nitrogen atmosphere and held at 400° C. for one hour. The film after curing at 400° C. showed a thickness of 7800 Å and a refractive index of 1.37 at 633 nm. The dielectric constant of this film was 2.1.

Example 2

0.468 gram of MeOPCS was dissolved in 2.340 grams of iso-butanol. Then 0.234 gram of 1 M hydrochloric acid was added. The mixture was sonicated for 2 minutes to ensure homogeneity. It was then filtered through a 0.2 micron filter. After aging in air for 30 minutes, several drops of the solution were dropped onto a Si wafer substrate (2 cm×2 cm, stuck at the center of a piece of 2'×2" cover glass by means of double stick tape). Then the wafer was spun at 1000 rpm for 25 seconds. The film was allowed to gel in air for about 60 minutes before aging. Aging was carried out by immersing the film in a solution of 5 vol % of 1.0M NH$_4$OH in iso-butanol (pH ~9.5) and holding the film at room temperature for 4 days. After washing by hexanes, the film was immersed in a solution of trimethylchlorosilane in hexanes (10 wt %) for two hours. After that, the film was heated to 400° C. at the rate of 1° C./min in a flowing nitrogen atmosphere and held at 400° C. for one hour. The film after cure at 400° C. showed film thickness of 8400 Å and refractive index of 1.31 at 633 nm. The dielectric constant of this film was 2.1.

Example 3

0.468 gram of MeOPCS was dissolved in 2.340 grams of iso-butanol. Then 0.234 gram of 1 M hydrochloric acid was added. The mixture was sonicated for 2 minutes to ensure homogeneity. It was then filtered through a 0.2 micron filter. After aging in air for 10 minutes, several drops of the solution were dropped onto a Si wafer substrate (2 cm×2 cm, stuck at the center of a piece of 2"×2' cover glass by means of double stick tape). Then the wafer was spun at 1000 rpm for 25 seconds. The film was gelled in air for about 60 minutes before aging. Aging was carded out by immersing the gelled film in a solution of 5 vol % of 1.0M NH$_4$OH in iso-butanol (pH ~9.5) and holding the film at room temperature for 4 days. Then the film was washed by hexanes and immersed in a solution of trimethylchlorosilane in hexane (10 wt %) for two hours. After that, the film was heated to 400° C. at the rate of 1° C./min in a flowing nitrogen atmosphere and held at 400° C. for one hour. The film after drying at 400° C. showed a film thickness of 5700 Å and refractive index of 1.33 at 633 nm. The dielectric constant of this film was 2.1.

Example 4

0.468 gram of MeOPCS was dissolved in 2.340 grams of iso-butanol. Then 0.234 gram of 1 M hydrochloric acid was added. The mixture was sonicated for 2 minutes to ensure homogeneity. It was then filtered through a 0.2 micron filter. After aging in air for 20 minutes, several drops of the solution were dropped onto a Si wafer substrate (2 cm×2 cm, stuck at the center of a piece of 2"×2" cover glass by means of double stick tape). Then the wafer was spun at 1000 rpm for 25 seconds. The film was allowed to gel in air for about 60 minutes before aging. Further aging was carried out by immersing the gelled film in a solution of 5 vol % of 1.0M NH$_4$OH in iso-butanol (pH ~9.5) and holding at room temperature for 4 days. Then the film was washed by hexane and immersed in a solution of trimethylchlorosilane in hexane (10 wt %) for two hours. After that, the film was heated to 400° C. at the rate of 1° C./min in a flowing nitrogen atmosphere and held at 400° C. for one hour. The film after drying at 400° C. showed a film thickness of 7000 Å and refractive index of 1.30 at 633 nm. The dielectric constant of this film was 2.0.

Example 5

0.419 gram of MeOPCS was dissolved in 2.095 grams of iso-butanol. Then 0.210 gram of 1 M hydrochloric acid was added. The mixture was sonicated for 2 minutes to ensure homogeneity. It was then filtered through a 0.2 micron filter. After aging in air for 30 minutes, several drops of the solution were dropped onto a Si wafer substrate (2 cm×2 cm, stuck at the center of a piece of 2'×2' cover glass by means of double stick tape). Then the wafer was spun at 1000 rpm for 25 seconds. The film was allowed to gel in air for about 60 minutes before aging. Aging was carried out by immersing the gelled film in a solution of 5 vol % of 1.0M NH$_4$OH in iso-butanol (pH ~9.5) and holding at room temperature for 4 days. Then the film was washed by hexanes and then was immersed in a solution of trimethylchlorosilane in hexane (10 wt %) and the solution was refluxed for a couple hours. After that, the film was heated to 400° C. at the rate of 1° C./min in a flowing nitrogen atmosphere and held at 400° C. for one hour. The film after cure at 400° C. showed film thickness of 9300 and refractive index of 1.36 at 633 nm. The dielectric constant of this film was 2.4.

Example 8

0.330 gram of MeOPCS was dissolved in 1.65 grams of n-Butanol. Then 0.165 gram of 1M hydrochloric acid was added. The mixture was sonicated for 2 minutes to ensure homogeneity. It was then filtered through a 0.45 micron filter. Several drops of the solution were dropped onto a Si wafer substrate (2 cm×2 cm, stuck at the center of a piece of 2"×2" cover glass by means of double stick tape). Then the wafer was spun at 1000 rpm for 30 seconds. The film was baked in an oven at 120° C. for 30 minutes. Then the film was heated to 500° C. at the rate of 1.5° C./min in a flowing nitrogen atmosphere and held at 500° C. for one hour. The film showed film thickness of 5300 Å and refractive index of 1.40 at 633 nm. The dielectric constant of this film was 2.7.

Example 9

0.280 gram of MeOPCS and 0.140 gram of template (PEO-b-PPO-b-PEO block copolymer) was dissolved in 1.40 grams of n-Butanol. Then 0.140 gram of hydrochloric acid (1M) was added. The mixture was sonicated for 2 minutes to ensure homogeneity. It was then filtered through a 0.45 micron filter. Several drops of the solution were dropped onto a Si wafer substrate (2 cm×2 cm, stuck at the center of a piece of 2"×2" cover glass by means of double stick tape) and the wafer was spun at 1000 rpm for 30 seconds. The film was baked in an oven at 120° C. for 30 minutes. Then the film was heated to 500° C. at the rate of 1.5° C./min in a flowing nitrogen atmosphere and held at 500° C. for one hour. The film showed film thickness of 8500 Å and refractive index of 1.30 at 633 nm. The capacitance was measured using the same method as in Example 1. The dielectric constant of this film was 1.8.

Examples 10–12

The experiment of example 9 was repeated, except that the ratio of the template material to MeOPCS was 1/5, 3/10 and 2/5 in examples 10, 11 and 12, respectively, rather than 1/2 as in example 9. The measured film thickness, measured refractive index and measured dielectric constant for examples 8–12 are provided in Table II, below, and are illustrated in FIGS. 1A, 1B and 1C, respectively.

TABLE II

| Example Number | Template Loading (in weight %) | Thickness (Angstroms) | Refractive Index | Dielectric Constant |
| --- | --- | --- | --- | --- |
| 8 | 0 | 5300 | 1.40 | 2.7 |
| 10 | 20 | 7000 | 1.35 | 2.31 |
| 11 | 30 | 8000 | 1.34 | 2.4 |
| 12 | 40 | 8300 | 1.33 | 1.89 |
| 9 | 50 | 8500 | 1.3 | 1.8 |

Example 13

0.330 gram of MeOPCS was dissolved in 1.65 grams of iso-Butanol. Then 0.165 gram of 1M hydrochloric acid was added. The mixture was sonicated for 2 minutes to ensure homogeneity. It was then filtered through a 0.45 micron filter. Several drops of the solution were dropped onto a Si wafer substrate (2 cm×2 cm, stuck at the center of a piece of 2"×2" cover glass by means of double stick tape). Then the wafer was spun at 1000 rpm for 30 seconds. The film was baked in an oven at 120° C. for 30 minutes. Then the film was heated to 500° C. at the rate of 1.5° C./min in a flowing nitrogen atmosphere and held at 500° C. for one hour. The film showed film thickness of 7000 Å and refractive index of 1.40 at 633 nm. The capacitance was measured using the same method as in Example 1. The dielectric constant of this film was 2.54.

Example 14

0.38 gram of MeOPCS and 0.19 gram of PEO-b-PPO-b-PEO template was dissolved in 1.9 grams of iso-Butanol. Then 0.19 gram of hydrochloric acid (1M) was added. The mixture was sonicated for 2 minutes to ensure homogeneity. It was then filtered through a 0.45 micron filter. Several drops of the solution were dropped onto a Si wafer substrate (2 cm×2 cm, stuck at the center of a piece of 2"×2" cover glass by means of double stick tape). Then the wafer was spun at 1000 rpm for 30 seconds. The film was baked in an oven at 120° C. for 30 minutes. Then the film was heated to 500° C. at the rate of 1.5° C./min in a flowing nitrogen atmosphere and held at 500° C. for one hour. The film showed film thickness of 11,400 Å and refractive index of 1.28 at 633 nm. The capacitance was measured using the same method as in Example 1. The dielectric constant of this film was 1.78.

Examples 15–16

The experiment of example 14 was repeated, except that the ratio of the template material to MeOPCS was 3/10 and 2/5 in examples 15 and 16, respectively, rather than 1/2 as in example 14. The measured film thickness, measured refractive index and measured dielectric constant for examples 13–16 are provided in Table III, below, and are illustrated in FIGS. 2A, 2B and 2C, respectively.

TABLE III

| Example Number | Template Loading (in weight %) | Film Thickness (Angstroms) | Refractive Index | Dielectric Constant |
|---|---|---|---|---|
| 13 | 0 | 7000 | 1.397 | 2.54 |
| 15 | 30 | 8400 | 1.337 | 2.4 |
| 16 | 40 | 10,900 | 1.276 | 2.01 |
| 14 | 50 | 11,400 | 1.282 | 1.78 |

Example 17

0.372 gram of methoxy and butoxy substituted PCS (MeO, BuO)PCS was dissolved in 1.860 grams of n-Butanol. Then 0.186 gram of 1M hydrochloric acid was added. The mixture was sonicated for 2 minutes to ensure homogeneity. It was then filtered through a 0.45 micron filter. Several drops of the solution were dropped onto a Si wafer substrate (2 cm×2 cm, stuck at the center of a piece of 2"×2" cover glass by means of double stick tape). Then the wafer was spun at 1000 rpm for 30 seconds. The film was baked in an oven at 120° C. for 30 minutes. Then the film was heated to 500° C. at the rate of 1.5° C./min in a flowing nitrogen atmosphere and held at 500° C. for one hour. The film showed film thickness of 2930 Å and refractive index of 1.40 at 633 nm. The capacitance was measured using the same method as in Example 1. The dielectric constant of this film was 2.1.

Several observations may be made about the films of the specific examples. The refractive index of the film of examples 6 and 7 measured at 633 nm ranges from 1.38 to 1.42, while the intrinsic dielectric constant of the film is below 2.0. In these examples, the intrinsic dielectric constant is relatively low compared to the refractive index. Without wishing to be bound to a particular theory, the present inventors believe that the lowered dielectric constant may be due to a decrease in uncompensated OH groups without an apparent corresponding increase in porosity. This decrease in uncompensated OH groups may be due to a reduction in the aging in air time to 15 minutes or less. The lower intrinsic dielectric constant achieved without a corresponding increase in porosity is advantageous because lower porosity improves the structural and corrosion resistance properties of the ILD film.

Several other observations may be made about the films of examples 1–17. First, the film thickness increases with an increasing percent of the template material in the solution. Likewise, the dielectric constant and the refractive index of the films generally decrease with an increasing percent of the template material in the solution. The refractive index and the dielectric constant of films made using iso-butanol solvent and n-butanol solvent were fairly similar. However, films made using iso-butanol solvent were about 5% to about 25% thicker that films made using n-butanol solvent. Thus, the choice of solvent affects at least some characteristics of the film. Furthermore, by using BuO/MeOPCS instead of MeOPCS as the precursor material, the dielectric constant of the film was lowered without significantly affecting the refractive index, as shown in Examples 8, 13 and 17. Thus, the choice of precursor material also affects at least some characteristics of the film.

As described in the examples, smooth, uniform, adherent films up to 11,400 Å thick were produced on Si wafer surfaces by sol-gel processing of a methoxy-substituted hyperbranched polycarbosilane, followed by curing. The dielectric constants of these films were found to range between 1.78 and 2.7. It is likely that the 1.78 value does not represent a lower limit on the dielectric constant and that even lower values can be obtained as a result of further optimization of the processing variables, such as by adding a template material to the parameters described in Examples 6 and 7. Thus, low k films are formed with a high thermal stability (to at least 500° C.) and greater solvent resistance than the purely organic films, along with superior toughness, hydrophobicity and lower intrinsic dielectric constant relative to silica-based films, due to the partial replacement of network Si—O—Si bonds by less polar Si—CH$_2$—Si linkages.

The foregoing description of the invention has been presented for purposes of illustration and description. It is not intended to be exhaustive or to limit the invention to the precise form disclosed, and modifications and variations are possible in light of the above teachings or may be acquired from practice of the invention. The description was chosen in order to explain the principles of the invention and its practical application. It is intended that the scope of the invention be defined by the claims appended hereto, and their equivalents.

What is claimed is:

1. A hybrid organic/inorganic organosilicon networked polymer material having a compositional formula [Si(O) CH$_2$]$_n$ and a dielectric constant of less than 2.4.

2. The material of claim 1, wherein:
   the material comprises an interlayer dielectric film located in a semiconductor device; and
   the dielectric constant of the film is less than 2.3.

3. The material of claim 2, wherein the dielectric constant of the film comprises an intrinsic dielectric constant of the material of the film without artificially induced porosity.

4. The material of claim 3, wherein the dielectric constant of the film ranges from 2.0 to less than 2.3.

5. The material of claim 4, wherein the film is thermally stable up to at least 500° C.

6. The material of claim 2, wherein the film contains artificially introduced porosity and the dielectric constant of the film is less than 2.1.

7. The material of claim 6, wherein the dielectric constant of the film ranges from 1.78 to 1.99.

8. The material of claim 2, wherein the thickness of the film ranges from 200 to 1,140 nm.

9. The material of claim 2, wherein the film is made by a sol-gel process using an alkoxy substituted hyperbranched polycarbosilane as a precursor.

10. The material of claim 9, wherein the film comprises the hybrid organic/inorganic organosilicon networked polymer material containing both Si—O—Si and Si—CH$_2$—Si bridging groups in its backbone.

11. The material of claim 1, wherein the material comprises a gas separation membrane, a microfluidic tunnel or a waveguide.

12. A solid state device, comprising:
   an active device;
   at least two conductive layers; and
   an interlayer dielectric film located between the at least two conductive layers, wherein the interlayer dielectric film comprises the material of claim 1.

13. The device of claim 12, wherein:
the active device comprises a semiconductor active device;
the at least two conductive layers comprise metal, silicide, titanium nitride or polysilicon interconnect metallization layers; and
the dielectric constant of the film is less than 2.3.

14. A method of making a hybrid organic/inorganic film, comprising:
providing an alkoxy substituted hyperbranched polycarbosilane precursor material;
dissolving the precursor material in a solvent to form a solution; adding a catalyst to the solution;
coating the solution over a substrate to form a gelled film; and
curing the gelled film to remove the solvent from the gelled film,
such that the hybrid organic/inorganic film with a dielectric constant of less than 2.4 is formed;
wherein the hybrid organic/inorganic film comprises a networked organosilicon polymer film having a compositional formula $[Si(O)CH_2]_n$.

15. The method of claim 14, wherein the catalyst comprises HCl.

16. The method of claim 15, wherein the catalyst comprises 0.2M to 1M HCl.

17. The method of claim 15, wherein the solvent is selected from the group consisting of n-butanol and iso-butanol.

18. The method of claim 17, wherein the alkoxy substituted hyperbranched polycarbosilane precursor material has a compositional formula: $[(MeO)_3SiCH_2]_w[(MeO)_2SiCH_2]_x[MeOSiCH_2]y[SiCH_2]_z$.

19. The method of claim 17, wherein the alkoxy substituted hyperbranched polycarbosilane precursor material has a compositional formula: $[(MeO,BuO)_3SiCH_2]_w[(MeO,BuO)_2SiCH_2]_x[(MeO,BuO)SiCH_2]_y[SiCH_2]_z$.

20. The method of claim 14, wherein the step of coating the solution over a substrate comprises spin coating the solution over the substrate.

21. The method of claim 20, wherein the step of spin coating occurs 15 minutes or less after preparation of the solution is completed.

22. The method of claim 21, wherein the step of spin coating comprises coating the solution over the substrate and rotating the substrate for about 25 to about 60 seconds.

23. The method of claim 21, further comprising aging the coated solution after the step of spin coating the solution and before the step of curing the solution.

24. The method of claim 23, wherein the step of curing the gelled film comprises heating the gelled film to about 400 to about 500 ° C. at a rate of about 1 to about 1.5° C./minute and holding at about 400 to about 500° C. for about 60 to about 120 minutes in an inert ambient.

25. The method of claim 24, further comprising baking the gelled film at a temperature below 400° C. prior to the step of curing.

26. The method of claim 14, wherein the hybrid organic/inorganic film has a dielectric constant of less than 2.3.

27. The method of claim 26, wherein the film comprises an interlayer dielectric film located in a semiconductor device.

28. The method of claim 27, wherein:
a template forming material for artificially generating pores in the film is not used to form the film; and
the dielectric constant of less than 2.3 comprises an intrinsic dielectric constant of the film.

29. The method of claim 28, wherein the dielectric constant of the film ranges from 2.0 to less than 2.3.

30. The method of claim 27, further comprising:
adding a template material to the solution; and
removing the template material during the step of curing such that porosity is introduced into the film.

31. The method of claim 30, wherein the template material comprises PEO-b-PPO-b-PEO.

32. The method of claim 30, wherein the dielectric constant of the film ranges from 1.78 to 1.99.

33. The method of claim 14, wherein:
the film is thermally stable up to at least 500° C.;
a thickness of the film ranges from 200 to 1,140 nm; and
the dielectric constant of the film is less than 2.3.

34. The method of claim 33, wherein the film comprises a hybrid organic/inorganic organosilicon networked polymer containing both Si—O—Si and Si—$CH_2$—Si bridging groups in its backbone.

35. The method of claim 14, wherein the step of coating the solution over a substrate comprises coating the solution over a metal, silicide, titanium nitride or polysilicon interlevel metallization located over a semiconductor device.

36. The method of claim 35, wherein the step of coating the solution comprises coating the solution directly onto the interlevel metallization.

37. A method of making a semiconductor device, comprising:
providing a semiconductor device located in or over a substrate, and having an interlevel metallization;
providing a substituted hyperbranched polycarbosilane precursor material;
dissolving the precursor material in a solvent to form a solution;
adding a catalyst to the solution;
coating the solution over the interlevel metallization to form a gelled film; and
curing the gelled film to remove the solvent from the gelled film,
such that the hybrid organic/inorganic film with a dielectric constant of less than 2.4 is formed over the interlevel metallization;
wherein the hybrid organic/inorganic film comprises a networked organosilicon polymer film having a compositional formula $[Si(O)CH_2]_n$.

38. The material of claim 1, wherein the dielectric constant of the material ranges from 1.78 to less than 2.4.

39. The material of claim 1, wherein the dielectric constant of the material ranges from 2.0 to 2.3.

40. The material of claim 2, wherein the dielectric constant of the film ranges from 1.78 to less than 2.3.

41. The material of claim 2, wherein the dielectric constant of the film ranges from 2.0 to less than 2.3.

* * * * *